United States Patent [19]

Horne

[11] 4,097,309
[45] Jun. 27, 1978

[54] THERMALLY ISOLATED SOLAR CELL CONSTRUCTION

[75] Inventor: William E. Horne, Bellevue, Wash.

[73] Assignee: The Boeing Company, Seattle, Wash.

[21] Appl. No.: 764,383

[22] Filed: Jan. 31, 1977

[51] Int. Cl.² .............................................. H01L 31/06
[52] U.S. Cl. ........................... 136/89 PC; 136/89 CC; 156/272; 250/238
[58] Field of Search ............. 136/89 P, 89 PC, 89 H, 136/89 CC; 250/238

[56] References Cited

U.S. PATENT DOCUMENTS

| 3,018,313 | 1/1962 | Gattone | 136/89 |
|---|---|---|---|
| 3,532,551 | 10/1970 | Webb | 136/89 |
| 3,990,914 | 11/1976 | Weinstein et al. | 136/89 |
| 3,999,283 | 12/1976 | Dean et al. | 29/572 |
| 4,002,031 | 1/1977 | Bell | 60/641 |
| 4,003,756 | 1/1977 | Abrams | 136/89 PC |

FOREIGN PATENT DOCUMENTS

| 2,533,166 | 12/1976 | Germany | 136/89 |

Primary Examiner—John H. Mack
Assistant Examiner—Aaron Weisstuch
Attorney, Agent, or Firm—Thomas H. Murray

[57] ABSTRACT

Thermal isolation shields consisting of two glass slides separated by insulating standoffs are positioned upon the front radiation receiving surface of a solar cell and/or upon the back surface of the solar cell. One of the two glass plates is made from material selected to absorb and radiate electromagnetic wave energy with a wavelength above 5 microns to prevent overheating of the cell. The space between the two cover plates forms a thermal gap that is, if desired, bridged by a bimetallic strip. The strip is adhered to one of the plates and has a reverse bend to extend along the face surface of the opposed cover plate. The strip distorts under an increased temperature to break the bridge between the two plates and thereby isolates the solar cell from the thermal shield formed by the outer cover plate until there is a sufficient reduction in temperature at which the bimetallic strip reestablishes conductive contact between the cover plates. Each solar cell assembly in an array is adhered to a substrate by first bonding glass pads to the substrate and then heating the cell and glass pads to a temperature of about 400° while applying an electrical potential of the order of 400 volts with the glass being negative potential with respect to the cell. A hermetic bond is achieved without the use of adhesives.

12 Claims, 6 Drawing Figures

THERMALLY ISOLATED SOLAR CELL CONSTRUCTION

BACKGROUND OF THE INVENTION

This invention relates to solar energy collectors, and more particularly to arranging spaced-apart and superimposed cover plates upon the radiation absorbing surface and/or the opposite surface containing an electrical contact for a solar cell. Moreover, the present invention relates to a novel method for bonding such a solar cell onto a support surface through the use of glass pads and electrostatic bonding without the use of adhesives.

Solar cells are conventionally arranged in an array for converting incident solar radiation to electrical power. Each solar cell includes a substrate of semiconductive material of one type conductivity forming a P-N junction with a layer of semiconductive material of the opposite type conductivity. Solar cells of this type, particularly when used in space missions, are vulnerable to thermal damage when exposed to either highly concentrated sunlight or to continuous wave laser energy. The vulnerable components of current solar cell designs are (1) the soldered interconnects between the solar cells and the power distribution network, (2) the adhesive bond between the substrate and the support surface as well as the bond between the cover slide and the cell, (3) the electrical parameters of the solar cell and (4) the cover slide material.

A single cover slide is conventionally adhered to the radiation receiving surface of a solar cell through the use of special-purpose adhesives. Such adhesives frequently have a poor heat conduction property and must remain functional over an extended period of time without deterioration to the solar radiation transmission property. Should the adhesive become opaque to the spectrum of solar radiation particularly useful for conversion to electrical power, then the effectiveness of the solar cell is diminished. The wavelength of solar radiation which is particularly useful for conversion to electrical power through the use of solar cells has an upper cutoff point at about the wavelength of infrared, i.e., not above 5 microns. Thus, it becomes desirable to shield the solar cell from infrared heat energy which has a relatively long wavelength to avoid overheating of the cell and protect the vulnerable components as enumerated hereinbefore.

SUMMARY OF THE INVENTION

It is an object of the present invention to provide an improved arrangement of cover slide members to form a thermal isolation shield for a solar cell.

It is a further object of the present invention to provide a double cover slide separated by thermally insulating standoffs to form a thermal isolation shielf for the front radiation receiving surface of a solar cell as well as the rear surface of the cell, if desired.

It is still another object of the present invention to provide a thermal isolation shield including spaced-apart cover slides separated by a bridge which includes a bimetallic strip contacting the mutually facing surfaces of the cover slides and constructed in a manner to distort under an increased temperature to deflect out of contact with one of the cover plates and thereby break the thermal bridge which is reestablished upon cooling.

It is still a further object of the present invention to provide a method for adhering solar cells onto a support surface by field-assisted electrostatic bonding of a solar cell onto glass pads which have been previously bonded onto a substrate material in a manner to carry out the entire mounting procedure without the use of adhesives.

According to the present invention, a solar radiation converter is provided comprising the combination of means for converting electromagnetic wave energy into electrical energy, the means including a substrate of semiconductive material of one type conductivity forming a P-N junction with a layer of semiconductive material of the opposite type conductivity, the means having a receiver surface adapted for exposure to electromagnetic wave energy for conversion to electrical power which is transmitted from the means by electrical interconnects adhered to a surface thereof distinct from the radiation receiving surface, a first cover plate covering a least one of the surfaces of the means for converting, a second cover plate covering the first cover plate in an outwardly, spaced-apart relation, one of the first and second cover plates being adapted to absorb and radiate incident electromagnetic wave energy with a wavelength above 5 microns, and standoff members interposed between the first and second cover plates in a manner to form a gap therebetween to define a thermal isolation barrier.

The aforementioned first and second cover plates are preferably formed from glass material such as quartz. According to a further embodiment of the present invention, the combination further includes a bimetallic bridge in the gap formed by the standoff members between the cover plates, the bimetallic bridge contacting a face surface of each cover plate and bent over upon itself to deflect under thermal heating out of contact with one of the cover plates. The bridge is a composite of two dissimilar metal strips formed from metals selected from the group consisting of copper, aluminum and steel, or any metal having dissimilar thermal expansion coefficients.

The present invention further provides a method of making a bond between a substrate and a solar cell by the steps including locating a glass support pad upon a substrate, bonding the pad onto the substrate to provide a smooth, outwardly facing support surface on the pad, arranging a solar cell upon the outwardly facing support surface of the pad, heating the solar cell and the support pad to a temperature in the range of about 300° to about 600° C, establishing an electrical field within the interface region between the solar cell and the support pad while in mutual contact in a manner such that the glass suport pad has a negative electrical potential with respect to the solar cell, maintaining the electrical field between the heated support pad and the heated solar cell for a period of time sufficient to form a molecular bond, and thereafter cooling the solar cell and support pad and removing the established electrical field.

According to the preferred method, a glass support pad is bonded onto the substrate at each of a plurality of spaced-apart locations to provide correspondingly located, outwardly facing smooth surfaces to support the solar cell for bonding thereto. The glass pads are preferably fused silica and the surface on the cell to which the glass pad is adhered by the molecular bond is a polished aluminum surface. It is preferred to heat the solar cell and support pad prior to bonding to a temperature of 400° while the electrostatic field is established at a voltage selected between about 400 to 500 volts.

These features and advantages of the present invention as well as others will be more fully understood when the following description is read in light of the accompaying drawings, in which.

Figures 1, 2, 3, 4, 5, 6:
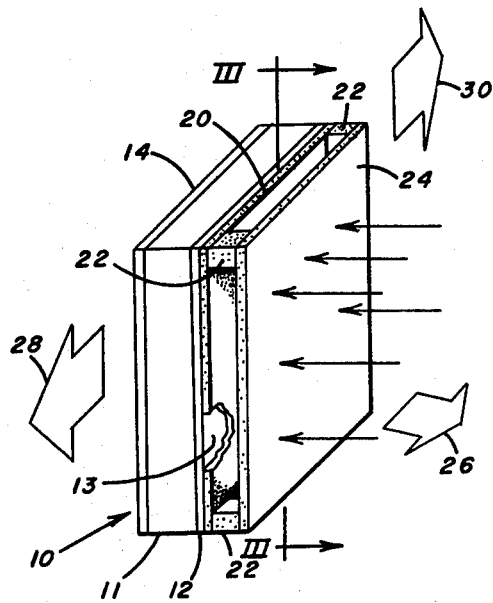
FIG. 1 illustrates a thermal isolation shield adhered to a face surface of a solar cell according to the present invention.
FIG. 2 is a graph showing the transmission spectra of quartz which is the preferred material to form the cover slides in the thermal isolation shield.
FIG. 3 is a sectional view taken along line III—III of FIG. 1 but illustrating a modified form of a thermal shield including a bimetallic bridge.
FIG. 4 is a view similar to FIG. 3 but illustrating the deflection of the bimetallic bridge out of contact with a cover slide forming part of the thermal shield.
FIG. 5 is a perspective view of a solar cell adhered by glass pads to a support substrate by the method of electrostatic bonding according to the present invention.
FIG. 6 is an expanded view illustrating the arrangement of parts and operating parameters for the electrostatic bonding method of the present invention.

FIG. 1 illustrates the novel concept of the present invention addressed to a thermal isolation shield wherein a solar cell 10 is per se constructed in a manner which is well known in the art and includes a substrate 11 of semiconductive material of one type conductivity, typically silicon, forming a P-N junction with a layer of semiconductive material 12 of the opposite type conductivity. The outer face surface 13 of the cell is adapted to receive incident electromagnetic wave energy for conversion to electrical power by the cell. A soldered interconnect usually extends between the layer 12 of semiconductive material and power distribution network. A second electrode formed, for example, by a deposited layer 14 of aluminum material upon the back face surface of the substrate 11 is also connected by a soldered interconnect to the power distribution system.

According to the present invention a thermal isolation shield for the solar cell includes a composite of two cover slides separated by thermally insulated standoffs. It is to be understood that the composite of two cover slides may be arranged as shown in FIG. 1 upon the radiation receiving surface 13 of the solar cell and/or upon the layer 14 at the back surface of the solar cell. The construction of the thermal isolation shield is the same in either event. More specifically, an inner cover slide 20 is adhered to the face surface of the solar cell by the method of electrostatic bonding to be hereinafter more fully described. Thermally insulated standoffs 22 are arranged at the four corners of the cover slide 20 to carry an outer cover slide 24 in a spaced-apart relation with the cover slide 20. The material used to form the standoffs 22 preferably is the same as the material which is used to form the cover slides. The material selected may be any suitable well-known form of glass including quartz which has a transmission spectrum illustrated by the graph in FIG. 2. In this regard, it will be noted that quartz has a transmission cutoff of incident solar radiation at about 5 microns. Thus, quartz is the particularly suitable material to form at least one of the cover slides since such a cover slide functions effectively as a thermal isolation shield by absorbing long wavelength heat energy, i.e., above 5 microns and irradiates it preferably back to space, i.e., away from the cell. However, the thermal isolation shield formed by the composite of cover slides 20 and 24 must be transparent to light in the visible spectrum.

FIG. 1 further illustrates the energy transfer mechanism provided by the thermal isolation shield. In this regard, the electromagnetic energy from the sun has an intensity of about 0.140 watt/cm$^2$ which is incident upon the cover slide 24. The radiated energy from cover slide 24 is indicated by arrow 26 by the expression $\epsilon AT^4$. In a similar manner, arrow 28 represents radiated energy from the substrate given by the same expression $\epsilon AT^4$. Arrow 30 represents the output of electrical energy at a conversion efficiency rate of about 10%. Thus, it can be seen that the energy absorbed by an array of such solar cells from the sun must be either converted to electrical energy or irradiated back into space via the front and/or back surface of each cell. The spaced-apart arrangement of cover slides 20 and 24 provides a secondary shield for the cell whereby, under normal operating conditions, an increased operating temperature of the cell may be anticipated.

To facilitate maintaining a normal operating temperature over an extended temperature range, a further embodiment of the present invention, illustrated in FIGS. 3 and 4, has the unique feature of a bimetallic bridge 32 interposed between the cover slides 20 and 24. The bimetallic bridge 32 is formed from two thin strips 33 and 34 of dissimilar metals having different thermal expansion properties so that they deflect within the elastic limits of the materials. The metals used to form these strips are selected from the group consisting of copper, aluminum and steel or any metals having dissimilar thermal expansion coefficients. The bridge has a strip-like form which is narrow and bent over on itself by a reverse bend. One leg of the bridge extends along the face surface at one or more marginal edges of either plate 20 or plate 24. It will be understood that the bridge may be bonded to either plate depending upon specific needs. For the purpose of describing the operation of the bimetallic bridge, it will be assumed that a leg of the bridge is bonded to plate 20 whereby at a normal operating temperature, the remaining leg of the bridge extends along the face surface of plate 24. When the cover slide and bridge experience a rise in temperature, the bimetallic strip bends away from the unbonded surface of plate 24, thus breaking thermal contact provided by the bridge between the cell and the outer cover plate. The cell is now thermally isolated from the heat shield by the outer cover plate 24. This arrangement of parts is illustrated in FIG. 4 wherein it will be observed that the bimetallic bridge is deflected to form a gap between the bridge and cover plate 24. Special coatings may be selected to reflect a certain spectral region of incident radiation. Such coatings are well known in the art and may be added to either the cover plate 24 or cover plate 20 to increase the thermal isolation by selectively rejecting heat in specified energy intervals. Examples of such coatings are shown in U.S. Pat. Nos. 3,076,681, 3,174,537, 3,272,986, 3,176,679 and 3,176,678.

According to a further feature of the present invention, a field-assisted electrostatic bonding method is employed to adhere the solar cell onto a support substrate. The principle, per se, of sealing glass to metal at an elevated temperature under an applied electrostatic field is described in a paper entitled "Field Assisted Glass-Metal Sealing," *Journal of Applied Physics,* September 1969, Vol. 40, No. 10. The parameters of this sealing process have been modified by the method of the present invention which may, if desired, be employed to adhere the cover slide 20 onto the face surface 13 of the cell and/or onto the face surface 14, depending on whether it is desired to provide the thermal isolation shield upon these surfaces of the cell. As described hereinbefore, solar cells are typically arranged as an array of such cells upon a suitable substrate which includes a distribution network for the electrical power generated by the cells. The substrate, as shown in FIGS. 5 and 6, consists of a pre-formed mat made from a lattice of high-temperature material. The mat may be of any desired configuration but typically includes a window opening 42. These openings are defined by parallel side rails 43 joined with cross members 44 which are spaced apart at a distance corresponding essentially to the height of the cell. Bonded onto the substrate material of the mat at spacings corresponding to the desired contact areas with the cell are pads 45 made from fused silica or other suitable glass material. The pads are bonded onto the mat by thermal compression techniques which are per se well known in the art and may be employed without material change to the technique. The pads 45 are important to the mounting method of the present invention because they provide a smooth, outer face surface 46 to which the solar cell is bonded. The procedure for field-assisted electrostatic bonding includes placing the solar cell upon the surfaces 46 provided by the pads 45 and then heating these parts to a temperature within the range of about 300° to about 600° C, preferably 400° C. By the time the desired elevated temperature is obtained, an electrostatic field is established between the cell and the pads. The electrostatic field results from an electrical potential usually selected within the range of 400 to 500 volts direct current with the glass pad 45 having a negative potential with respect to the cell which, therefore, is maintained at a positive potential. The applied electrostatic field to the heated glass pads causes the ions in the heated glass to drift toward the interface where the ions build up a tremendous pressure at the interface to the extent that a molecular bond is formed within a relatively short period of time, usually within a period of time not exceeding two minutes. After cooling the heated parts and removing the electrical field, a vacuum-tight and more specifically a hermetic seal is formed by the bond between the cell and the glass pads. It is not necessary to arrange the parts within a vacuum chamber during the bonding process, although the process may be carried out within an evacuated chamber, if desired. The process is suitable for hermetic bonding of semiconductor materials onto glass as well as metal and glass.

Although the invention has been shown in connection with certain specific embodiments, it will be readily apparent to those skilled in the art that various changes in form and arrangement of parts may be made to suit requirements without departing from the spirit and scope of the invention.

I claim as my invention:

1. A solar radiation converter comprising:
   means for converting electromagnetic wave energy into electrical energy, said means including a substrate of semiconductive material of one type conductivity forming a P-N junction with a layer of semiconductive material of the opposite type conductivity, said means having a receiver surface adapted for exposure to electromagnetic wave energy for conversion to electrical power, said means including electrical interconnect means adhered to a surface thereof distinct from said receiver surface,
   a first cover plate covering at least one of said surfaces of said means,
   a second cover plate covering said first cover plate in an outwardly, spaced-apart relation,
   one of said first and second cover plates being adapted to absorb and radiate incident electromagnetic wave energy with a wavelength above 5 microns, and
   standoff members interposed between said first and second cover plates in a manner to form a gap therebetween to define a thermal isolation barrier.

2. The solar radiation converter according to claim 1 wherein said first and second cover plates overlie said receiver surface.

3. The solar radiation converter according to claim 1 wherein said second cover plate consists of material for transmitting electromagnetic wave energy with a wavelength not in excess of 5 microns, and wherein said first and second cover plates overlie said receiver surface of said means for converting.

4. The solar radiation converter according to claim 1 wherein said standoff members and said cover plates are formed from the same material which is glass.

5. The solar radiation converter according to claim 1 wherein said first and second cover plates are formed from quartz.

6. The solar radiation converter according to claim 1 wherein said first and second cover plates are superimposed in spaced-apart relation to overlie said electrical interconnect means.

7. The solar radiation converter according to claim 1 further comprising a bimetallic bridge in the gap formed by said standoff members between said cover plates, said bimetallic bridge contacting a face surface of each of said cover plates for deflection under thermal heating out of contact with one of said cover plates.

8. The solar radiation converter according to claim 7 wherein said bimetallic bridge includes a composite of two strips of dissimilar metals.

9. The solar radiation converter according to claim 8 wherein said bimetallic bridge is a composite strip folded over upon itself with a reverse bend within the elastic limits of both of the dissimilar metals.

10. The solar radiation converter according to claim 9 wherein said metals are selected from the group consisting of copper, aluminum and steel.

11. The solar radiation converter according to claim 7 wherein said bimetallic bridge is bonded onto a face surface of said first cover plate.

12. The solar radiation converter according to claim 1 wherein said first and second cover plates overlie said receiver surface, said solar radiation converter further including a third cover plate covering said electrical interconnect means, a fourth cover plate covering said third cover plate in an outwardly, spaced-apart relation, one of said third and fourth cover plates being adapted to absorb and radiate incident electromagnetic wave energy with a wavelength above 5 mircons, and standoff members interposed between said third and fourth cover plates in a manner to form a gap therebetween to define a thermal isolation barrier.

* * * * *